(12) United States Patent  (10) Patent No.: US 9,105,623 B2
Chiang et al.  (45) Date of Patent: Aug. 11, 2015

(54) SEMICONDUCTOR DEVICE HAVING METAL GATE AND MANUFACTURING METHOD THEREOF

(75) Inventors: Wen-Tai Chiang, Tainan (TW); Chien-Ting Lin, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 214 days.

(21) Appl. No.: 13/480,499

(22) Filed: May 25, 2012

(65) Prior Publication Data

US 2013/0313648 A1   Nov. 28, 2013

(51) Int. Cl.
*H01L 21/8238* (2006.01)
*H01L 29/49* (2006.01)
*H01L 27/088* (2006.01)
*H01L 21/28* (2006.01)
*H01L 29/66* (2006.01)
*H01L 29/51* (2006.01)

(52) U.S. Cl.
CPC ...... *H01L 29/4966* (2013.01); *H01L 21/28088* (2013.01); *H01L 21/823842* (2013.01); *H01L 27/088* (2013.01); *H01L 29/6659* (2013.01); *H01L 29/66545* (2013.01); *H01L 29/517* (2013.01)

(58) Field of Classification Search
CPC .................. H01L 21/823842; H01L 21/8238; H01L 21/82385
See application file for complete search history.

(56) References Cited

U.S. PATENT DOCUMENTS

| | | |
|---|---|---|
| 6,066,533 A | 5/2000 | Yu |
| 6,492,217 B1 | 12/2002 | Bai |
| 6,552,377 B1 | 4/2003 | Yu |
| 6,696,345 B2 | 2/2004 | Chau |
| 6,790,719 B1 | 9/2004 | Adetutu |
| 6,794,234 B2 | 9/2004 | Polishchuk |
| 6,902,969 B2 | 6/2005 | Adetutu |
| 6,921,711 B2 | 7/2005 | Cabral, Jr. |
| 7,030,430 B2 | 4/2006 | Doczy |
| 7,074,664 B1 | 7/2006 | White |
| 7,109,079 B2 | 9/2006 | Schaeffer, III |
| 7,126,199 B2 | 10/2006 | Doczy |
| 7,157,378 B2 | 1/2007 | Brask et al. |
| 7,193,893 B2 | 3/2007 | Forbes |
| 7,208,366 B2 | 4/2007 | Tsai |
| 7,381,619 B2 | 6/2008 | Wang |
| 7,390,709 B2 | 6/2008 | Doczy |
| 7,488,656 B2 | 2/2009 | Cartier |
| 7,785,958 B2 | 8/2010 | Doczy |
| 8,383,500 B2 * | 2/2013 | Marxsen et al. ............. 438/585 |
| 2002/0127888 A1 | 9/2002 | Cho |
| 2005/0095763 A1 | 5/2005 | Samavedam |
| 2005/0202659 A1 | 9/2005 | Li |
| 2005/0275035 A1 | 12/2005 | Mathew |

(Continued)

*Primary Examiner* — Jae Lee
(74) *Attorney, Agent, or Firm* — Winston Hsu; Scott Margo

(57) ABSTRACT

A manufacturing method for semiconductor device having metal gate includes providing a substrate having a first semiconductor device and a second semiconductor device formed thereon, the first semiconductor device having a first gate trench and the second semiconductor device having a second gate trench, forming a first work function metal layer and an etch stop layer in the first gate trench and the second gate trench, forming a metal layer having a material the same with the first work function metal layer in the second gate trench, and forming a filling metal layer in the first gate trench and the second gate trench to form a second work function metal layer in the first gate trench.

4 Claims, 7 Drawing Sheets

(56) References Cited

U.S. PATENT DOCUMENTS

| | | |
|---|---|---|
| 2006/0040482 A1 | 2/2006 | Yang |
| 2006/0054943 A1 | 3/2006 | Li |
| 2007/0037335 A1 | 2/2007 | Chambers |
| 2007/0082445 A1 | 4/2007 | Yang |
| 2007/0138559 A1 | 6/2007 | Bohr |
| 2007/0148838 A1 | 6/2007 | Doris |
| 2007/0210354 A1 | 9/2007 | Nabatame |
| 2008/0076216 A1 | 3/2008 | Pae |
| 2008/0318371 A1 | 12/2008 | Lin |
| 2009/0057787 A1 | 3/2009 | Matsuki |
| 2009/0166769 A1 | 7/2009 | Metz |
| 2010/0052074 A1 | 3/2010 | Lin |
| 2010/0068877 A1 | 3/2010 | Yeh |
| 2010/0081262 A1 | 4/2010 | Lim |
| 2010/0127336 A1* | 5/2010 | Chambers et al. ............. 257/369 |
| 2010/0301427 A1* | 12/2010 | Lenski et al. ................. 257/392 |
| 2011/0215409 A1 | 9/2011 | Li et al. |
| 2011/0272767 A1 | 11/2011 | Yin |
| 2012/0094475 A1* | 4/2012 | Tsau ............................. 438/589 |
| 2012/0217590 A1* | 8/2012 | Babich et al. ................. 257/410 |
| 2012/0292637 A1* | 11/2012 | Beyer et al. ..................... 257/77 |
| 2013/0037865 A1* | 2/2013 | Nogami et al. ................ 257/288 |
| 2013/0175630 A1* | 7/2013 | Ando et al. .................... 257/368 |

* cited by examiner

SEMICONDUCTOR DEVICE HAVING METAL GATE AND MANUFACTURING METHOD THEREOF

BACKGROUND OF THE INVENTION

1. Field of the Invention

The invention relates to a semiconductor device having metal gate and manufacturing method thereof, and more particularly, to a semiconductor device having metal gate and manufacturing method capable of reducing process complexity.

2. Description of the Prior Art

With a trend toward scaling down the size of the semiconductor device, work function metals are used to replace the conventional polysilicon gate to be the control electrode that competent to the high dielectric constant (herein after abbreviated as high-K) gate dielectric layer. The conventional metal gate methods are categorized into the gate first process and the gate last process. Among the two main processes, the gate last process is able to avoid processes of high thermal budget and to provide wider material choices for the high-K gate dielectric layer and the metal gate, and thus the gate last process gradually replaces the gate first process.

In the conventional gate last process, a dummy gate or a replacement gate is formed on a substrate and followed by steps of forming a conventional metal-oxide semiconductor (MOS) transistor device. Subsequently, the dummy/replacement gate is removed to form a gate trench. Then the gate trench is filled with work function metals required by different conductivity types.

Accordingly, though the gate last process is able to avoid processes of high thermal budget and to provide wider material choices for the high-K gate dielectric layer and the metal gate, the gate last process still faces integrity requirements for the complicated processes and reliability requirement for the layers filling in the gate trench.

SUMMARY OF THE INVENTION

According to an aspect of the present invention, a manufacturing method of a semiconductor device having metal gate is provided. The method includes providing a substrate having a first semiconductor device and a second semiconductor device formed thereon, the first semiconductor device having a first gate trench, and the second semiconductor device having a second gate trench; forming a first work function metal layer in the first gate trench and the second gate trench; forming an etch stop layer in the first gate trench and the second gate trench; forming a metal layer having a material the same with the first work function metal layer in the second gate trench; and forming a filling metal layer in the first gate trench and the second gate trench to form a second work function metal layer in the first gate trench.

According to another aspect of the present invention, a manufacturing method of a semiconductor device having metal gate is provided. The manufacturing method includes providing a substrate having a the first semiconductor device and a second semiconductor device formed thereon; forming a first gate trench in the first semiconductor device; forming a first metal layer in the first gate trench; forming a second gate trench in the second semiconductor device; forming a second metal layer in the first gate trench and the second gate trench, the second metal layer having a material the same with the first metal layer; and forming a filling metal layer in the first gate trench and the second gate trench.

According to still another aspect of the present invention, a semiconductor device having metal gate is provided. The semiconductor device includes a substrate; a first metal gate positioned on the substrate, the first metal gate having a high-k gate dielectric layer, a first metal layer, and a filling metal layer; and a second metal gate positioned on the substrate, the second metal gate having the high-k gate dielectric layer, a second metal layer, and the filling metal layer. The second metal layer includes materials the same with the first metal layer, but a thickness of the second metal layer is smaller than a thickness of the first work function metal layer.

According to the manufacturing method of the semiconductor device having metal gate provided by the present invention, the first work function metal layer or the metal layer formed in the first gate trench is directly transmuted to be the second work function metal layer by forming the filling metal layer and by ion diffusion from the filling metal layer. Consequently, the complicated steps for forming different work function metal layers and removing unnecessary work function metal layers in the prior art are simplified according to the manufacturing method of the present invention. Briefly speaking, the metal gate process is simplified, the process complexity is reduced, and the gap-filling result is improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-5 are drawings illustrating a manufacturing method for a semiconductor device having metal gate provided by a first preferred embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4.

FIGS. 6-9 are drawings illustrating a manufacturing method for a semiconductor device having metal gate provided by a second preferred embodiment of the present invention, wherein FIG. 7 is a schematic drawing in a step subsequent to FIG. 6, FIG. 8 is a schematic drawing in a step subsequent to FIG. 7, and FIG. 9 is a schematic drawing in a step subsequent to FIG. 8.

FIGS. 10-13 are drawings illustrating a manufacturing method for a semiconductor device having metal gate provided by a third preferred embodiment of the present invention, wherein FIG. 11 is a schematic drawing in a step subsequent to FIG. 10, FIG. 12 is a schematic drawing in a step subsequent to FIG. 11, and FIG. 13 is a schematic drawing in a step subsequent to FIG. 12.

DETAILED DESCRIPTION

Figure 1:
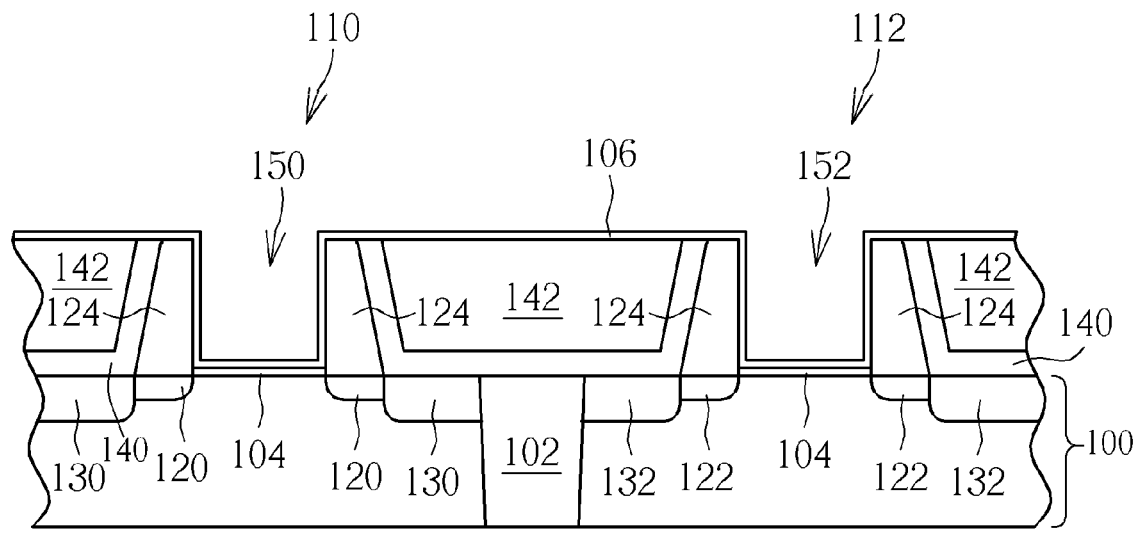

Please refer to FIGS. 1-5, which are drawings illustrating a manufacturing method for a semiconductor device having metal gate provided by a first preferred embodiment of the present invention. As shown in FIG. 1, the preferred embodiment first provides a substrate 100 such as silicon substrate, silicon-containing substrate, or silicon-on-insulator (SOI) substrate. The substrate 100 includes a first semiconductor device 110 and a second semiconductor device 112 formed thereon. A shallow trench isolation (STI) 102 is formed between the first semiconductor device 110 and the second semiconductor device 112 in the substrate 100 for providing electrical isolation. The first semiconductor device 110 includes a first conductivity type, the second semiconductor device 112 includes a second conductivity type, and the first conductivity type and the second conductivity type are complementary. In the preferred embodiment, the first semiconductor device 110 is an n-type semiconductor device and the second semiconductor device 112 is a p-type semiconductor device.

Please still refer to FIG. 1. The first semiconductor device 110 and the second semiconductor device 112 respectively includes a dielectric layer 104, a dummy gate (not shown) such as a polysilicon layer formed on the dielectric layer 104, and a patterned hard mask (not shown) formed on the polysilicon layer for defining the dummy gate. The first semiconductor device 110 and the second semiconductor device 112 respectively include first lightly doped drains (LDDs) 120 and second LDDs 122, a spacer 124, a first source/drain 130 and a second source/drain 132. Salicides (not shown) are respectively formed on the first source/drain 130 and the second source/drain 132. Additionally, the salicides are formed after forming contact openings when the post contact salicide process is adopted. After forming the first semiconductor device 110 and the second semiconductor device 112, a contact etch stop layer (CESL) 140 and an inter-layer dielectric (ILD) layer 142 are sequentially formed. Since the steps and material choices for the abovementioned elements are well-known to those skilled in the art, those details are omitted herein in the interest of brevity. Furthermore, selective strain scheme (SSS) can be used in the preferred embodiment. For example, a selective epitaxial growth (SEG) method can be used to form the first source/drain 130 and the second source/drain 132.

Please still refer to FIG. 1. After forming the CESL 140 and the ILD layer 142, a planarization process, such as a chemical mechanical polishing (CMP) process is performed to remove a portion of the CESL 140 and a portion of the ILD layer 142 to expose the patterned hard masks or the dummy gates of the first semiconductor device 110 and the second semiconductor device 112. Subsequently, a suitable etching process is performed to remove the patterned hard masks and the dummy gates of the first semiconductor device 110 and the second semiconductor device 112. Consequently, a first gate trench 150 is formed in the first semiconductor device 110 and a second gate trench 152 is formed in the second semiconductor device 112, simultaneously. And the dielectric layers 104 are exposed in bottoms of both of the first gate trench 150 and the second gate trench 152. It is noteworthy that the preferred embodiment can be integrated with the high-k last process; therefore the dielectric layer 104 exposed in the gate trenches 150/152 serves as an interfacial layer. It should be easily realized that though the preferred embodiment is integrated with the high-k last process, the preferred embodiment can be integrated with the high-k first process. Next, a high-k dielectric layer 106 is formed in the first gate trench 150 and the second gate trench 152. The high-k gate dielectric layer 106 includes high-k materials such as rare earth metal oxide. The high-k gate dielectric layer 106 can include material selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST).

Figure 2:
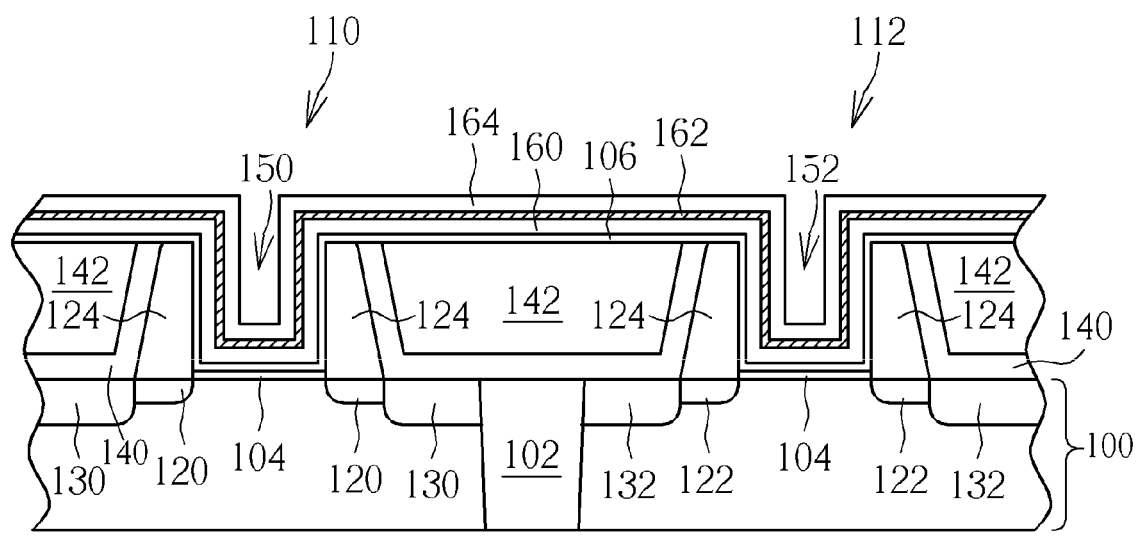

Please refer to FIG. 2. After forming the high-k gate dielectric layer 106, a first titanium nitride (hereinafter abbreviated as TiN) layer 160, an tantalum nitride (hereinafter abbreviated as TaN) layer 162, and a second TiN layer 164 are sequentially formed on the substrate 100. The first TiN layer 160, the TaN layer 162, and the second TiN layer 164 are formed by any suitable process, for example but not limited to an atomic layer deposition (ALD). Furthermore, it should be easily realized that TiN and TaN in the preferred embodiment are only exemplarily disclosed to show the elements, but not the atomic composition ratio. In other words, the atomic composition ratios of the first TiN layer 160, the TaN layer 162, and the second TiN layer 164 are not limited to 1:1. For example, the atomic composition ratio of the first TiN layer 160 and the second TiN layer 164 can be $Ti_xN_y$. As shown in FIG. 2, the first TiN layer 160, the TaN layer 162, and the second TiN layer 164 are formed in the first gate trench 150 and the second gate trench 152 with the second TiN layer 164 entirely covers the TaN layer 162 formed on bottoms and sidewalls of the first gate trench 150 and the second gate trench 152. The first TiN layer 160 serves as first work function metal layer, and the TaN layer 162, which is different from the first TiN layer 160 and the second TiN layer 164, serves as an etch stop layer. A thickness of the first TiN layer 160 is between 30 angstroms (Å) and 40Å, but not limited to this. A thickness of the TaN layer 162 is about 10Å, but not limited to this. And a thickness of the second TiN layer 164 is between 20Å and 40Å, but not limited to this, either. However, the thickness of the first TiN layer 160 and of the second TiN layer 164 can be adjusted according to work function requirement.

Figure 3:
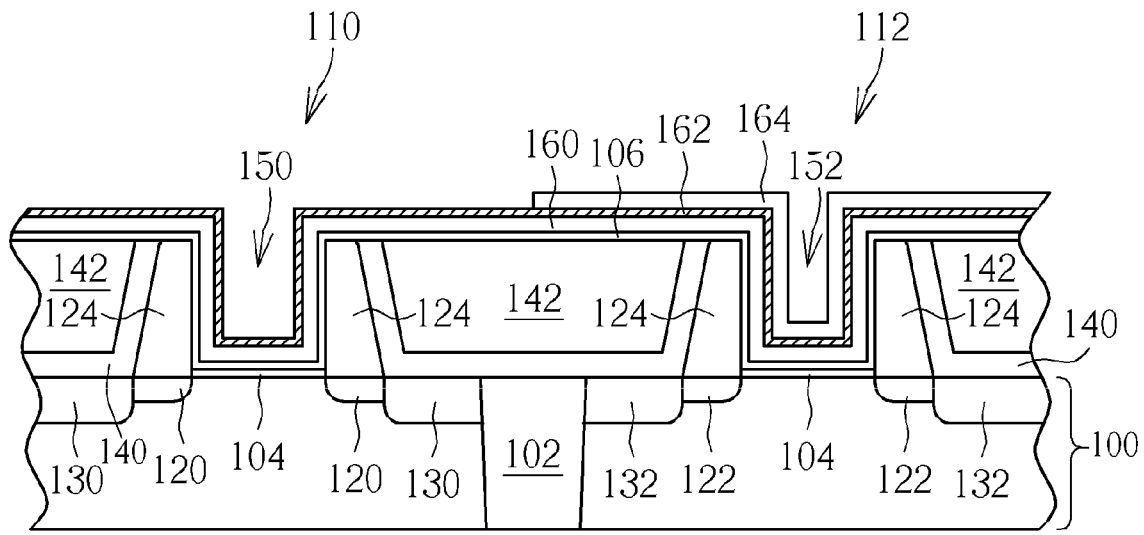

Please refer to FIG. 3. Next, a patterned protecting layer (not shown) is formed on the substrate 100 to protect the second TiN layer 164 in the second semiconductor device 112. Subsequently, an etching process is performed to remove the second TiN layer 164 from the first gate trench 150. Thus the TaN etch stop layer 162 is exposed in the bottom and the sidewall of the first gate trench 150. In other words, the second TiN layer 164 remains in the second semiconductor device 112 only, particularly remains in the bottom and the sidewall of the second gate trench 152. Since the etching process consumes the TaN etch stop layer 162, a thickness of the TaN etch stop layer 162 in the first semiconductor device 110 is smaller than a thickness of the TaN etch stop layer in the second semiconductor device 112. Subsequently, the patterned protecting layer is removed.

Figure 4:
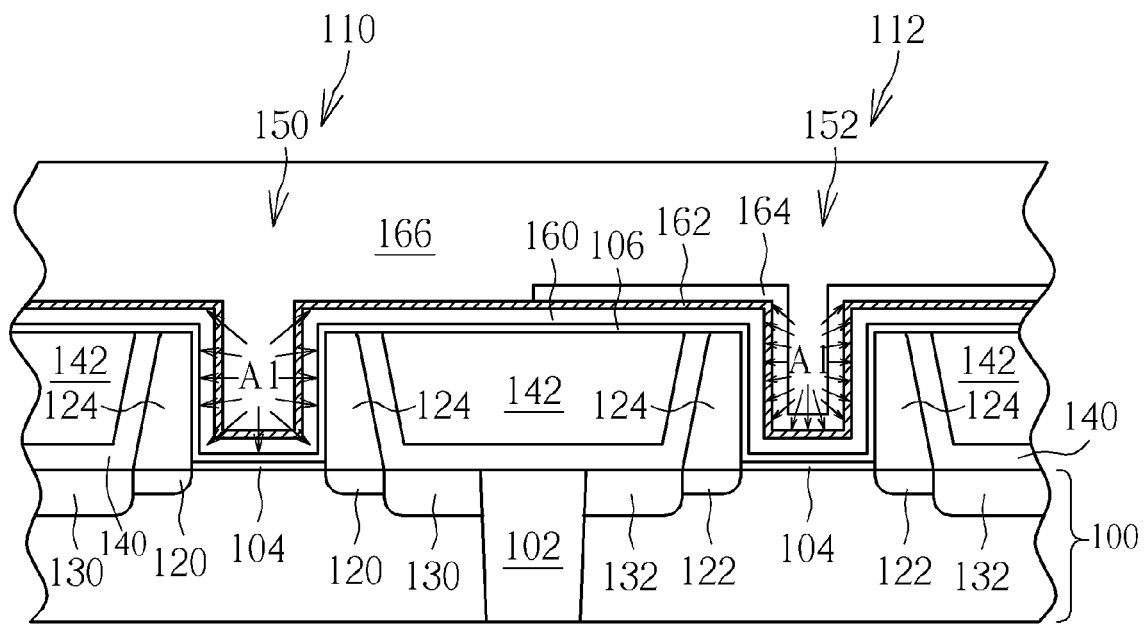

Please refer to FIG. 4. Next, a filling metal layer 166 is formed in both of the first gate trench 150 and the second gate trench 152. The filling metal layer 166 fills up the first gate trench 150 and the second gate trench 152. The filling metal layer 166 includes materials with low resistance and superior gap-filling characteristic, such as Al, titanium aluminide (TiAl), or titanium aluminum oxide (TiAlO), but not limited to this. As mentioned above, it should be easily realized that TiAl and TiAlO in the preferred embodiment are only exemplarily disclosed to show the elements, but not the atomic composition ratio. In other words, the atomic composition ratio of the filling metal layer 166 is not limited to 1:1. It is noteworthy that simultaneously with forming the filling metal layer 166, Al ions diffuse into the first TiN layer 160 in the first gate trench 150 from the filling metal layer 166 as shown in FIG. 4. Thus a work function of the first TiN layer 160 in the first gate trench 150 is tuned to 4.35 eV, and a TiAlN layer which satisfies with the requirement of the n-type semiconductor device is obtained. In other words, the first TiN layer 160 in the first gate trench 150 is transmuted to be a second work function metal layer 168 (shown in FIG. 5) by forming the filling metal layer 166.

Please still refer to FIG. 4. It is also noteworthy that in the second gate trench 152, the second TiN layer 164 serves as a barrier layer, and thus the Al ions arrive only in the second TiN layer 164 but is obstructed from the first TiN layer 160 by the second TiN layer 164 in the second gate trench 152. In other words, the second TiN layer 164 in the second gate trench 152 is transmuted to be a TiAlN layer 168 (also shown in FIG. 5) after forming the filling metal layer 166 while the first TiN layer 160 in the second gate trench 152 still serves as a first work function metal layer and provides a work function required by the p-type semiconductor device 112, that is 4.85 eV.

Figure 5:
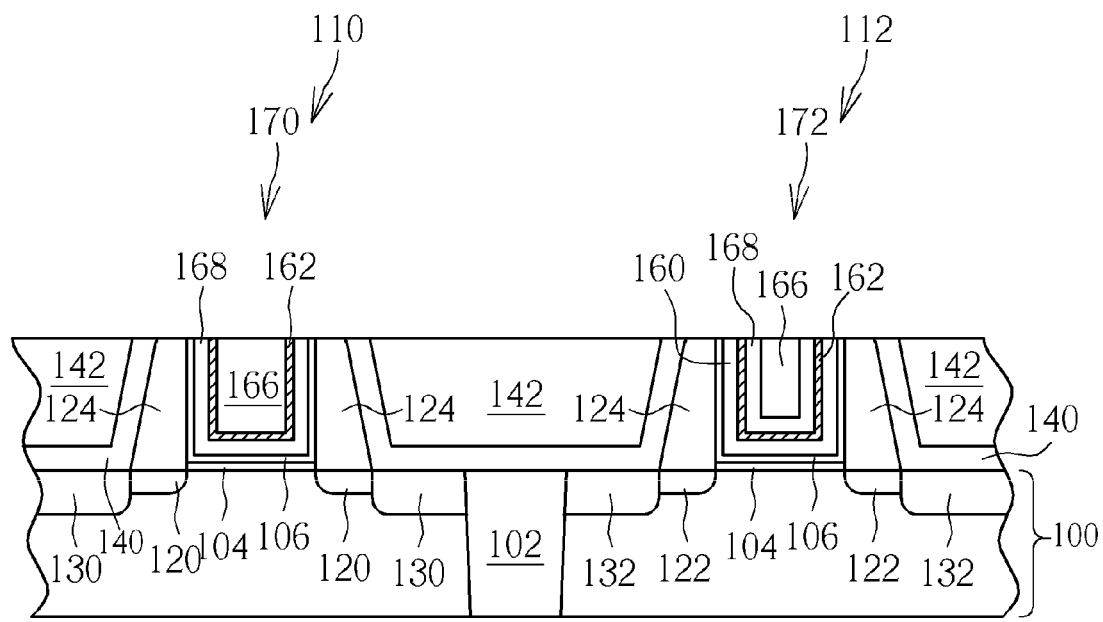

Please refer to FIG. 5. Subsequently, a planarization process, such as a CMP process, is performed to remove the unnecessary filling metal layer 166, second TiN layer 164, TaN layer 162, first TiN layer 160, and high-k gate dielectric layer 106. Consequently, a first metal gate 170 and a second metal gate 172 are obtained. In addition, the ILD layer 142 and the CESL 140 can be selectively removed and sequentially reformed on the substrate 100 for improving performance of the semiconductor devices 110/112 in the preferred embodiment. Since the abovementioned CMP process is well-known to those skilled in the art, those details are omitted in the interest of brevity.

Please refer to FIG. 5 again. According to the manufacturing method provided by the preferred embodiment, both of the first metal gate 170 and the second metal gate 172 include a TiAlN layer 168 having the Al ion diffused from the filling metal layer 166. However, a thickness of the TiAlN layer 168 of the second metal gate 172 is different from a thickness of the TiAlN layer 168 of the first metal gate 170. Furthermore, the second metal gate 172 includes a TiN layer 160 having no diffused Al ion, and thus the work function of the TiN layer 160 is significantly different from the work function of the TiAlN layer 168. In other words, the TiAlN layer 168 in the first metal gate 170 serves as the work function metal layer for the first semiconductor device 110 while the TiN layer 160 in the second metal gate 172 serves as the work function metal layer for the second semiconductor device 112 with the TiAlN layer 168 in the second metal gate 172 serving as a barrier layer. Additionally, the first metal gate 170 and the second metal gate 172 further include the TaN etch stop layer 162 having different etching rate from the TiN layer 160. More important, the TaN etch stop layer 162 in the first metal gate 170 is formed between the filling metal layer 166 and the TiAlN layer 168 while the TaN etch stop layer 162 in the second metal gate 172 is formed between the TiN layer 160 and the TiAlN layer 168.

According to the manufacturing method of the semiconductor device having metal gate provided by the preferred embodiment, the n-type work function metal layer 168 is spontaneously formed by Al diffusion during forming the filling metal layer 166. However, the p-type work function metal layer 160 is impervious to the Al diffusion due to the second TiN barrier layer 164. Accordingly, the complicated steps for forming different work function metal layers and removing unnecessary work function metal layers in the prior art are simplified, and thus the process complexity is reduced, the gap-filling result is improved, and the yield of the metal gate process is improved.

Figure 6:
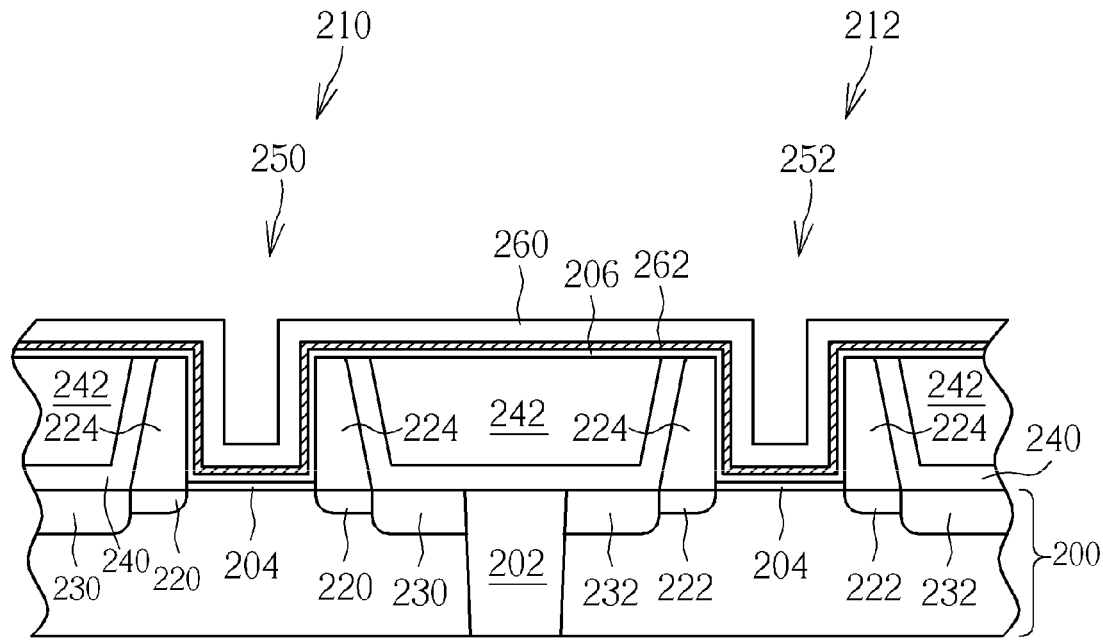

Please refer to FIGS. 6-9, which are drawings illustrating a manufacturing method for a semiconductor device having metal gate provided by a second preferred embodiment of the present invention. Please note that elements the same in both first and second preferred embodiments can include the same material, and thus those details are omitted in the interest of brevity. As shown in FIG. 6, the preferred embodiment first provides a substrate 200, and the substrate 200 includes a first semiconductor device 210 and a second semiconductor device 212 formed thereon. A STI 202 is formed between the first semiconductor device 210 and the second semiconductor device 212 in the substrate 200 for providing electrical isolation. The first semiconductor device 210 includes a first conductivity type, the second semiconductor device 212 includes a second conductivity type, and the first conductivity type and the second conductivity type are complementary. In the preferred embodiment, the first semiconductor device 210 is an n-type semiconductor device and the second semiconductor device 212 is a p-type semiconductor device.

Please still refer to FIG. 6. The first semiconductor device 210 and the second semiconductor device 212 respectively includes a dielectric layer 204, a dummy gate (not shown) such as a polysilicon layer formed on the dielectric layer 204, and a patterned hard mask (not shown) formed on the polysilicon layer for defining the dummy gate. The first semiconductor device 210 and the second semiconductor device 212 respectively include first LDDs 220 and second LDDs 222, a spacer 224, a first source/drain 230 and a second source/drain 232. Additionally, salicides (not shown) are respectively formed on the first source/drain 230 and the second source/drain 232. After forming the first semiconductor device 210 and the second semiconductor device 212, a CESL 240 and an ILD layer 242 are sequentially formed. Since the steps and material choices for the abovementioned elements are well-known to those skilled in the art, those details are omitted herein in the interest of brevity. Furthermore, selective strain scheme (SSS) can be used in the preferred embodiment. For example, a SEG method can be used to form the first source/drain 230 and the second source/drain 232.

Please still refer to FIG. 6. After forming the CESL 240 and the ILD layer 242, a planarization process is performed to remove a portion of the CESL 240 and a portion of the ILD layer 242 to expose the patterned hard masks or the dummy gates of the first semiconductor device 210 and the second semiconductor device 212. Subsequently, a suitable etching process is performed to remove the patterned hard masks and the dummy gates of the first semiconductor device 210 and the second semiconductor device 212. Consequently, a first gate trench 250 is formed in the first semiconductor device 210 and a second gate trench 252 is formed in the second semiconductor device 212, simultaneously. And the dielectric layers 204 are exposed in bottoms of both of the first gate trench 250 and the second gate trench 252. It is noteworthy that the preferred embodiment is also integrated with the high-k last process; therefore the dielectric layer 204 exposed in the gate trenches 250/252 serves as an interfacial layer. It should be easily realized that though the preferred embodiment is integrated with the high-k last process, the preferred embodiment can be integrated with the high-k first process. Next, a high-k dielectric layer 206 is formed in the first gate trench 250 and the second gate trench 252. After forming the high-k gate dielectric layer 206, a TaN layer 262 is formed on the substrate 200. The TaN layer 262 covers bottoms and sidewalls of the first gate trench 250 and the second gate trench 252. A thickness of the TaN layer 262 is exemplarily 10 Å, but not limited to this. After forming the TaN layer 262, a first TiN layer 260 is formed on the substrate 200. As shown in FIG. 6, the first TiN layer 260 also covers the bottoms and the sidewalls of the first gate trench 250 and the second gate trench 252. And a thickness of the first TiN layer 260 is between 30 Å and 40 Å, but not limited to this. A work function of the first TiN layer 260 is about 4.85 eV, therefore the first TiN layer 260 serves as a first work function metal layer for the p-type semiconductor device 212.

Figure 7:
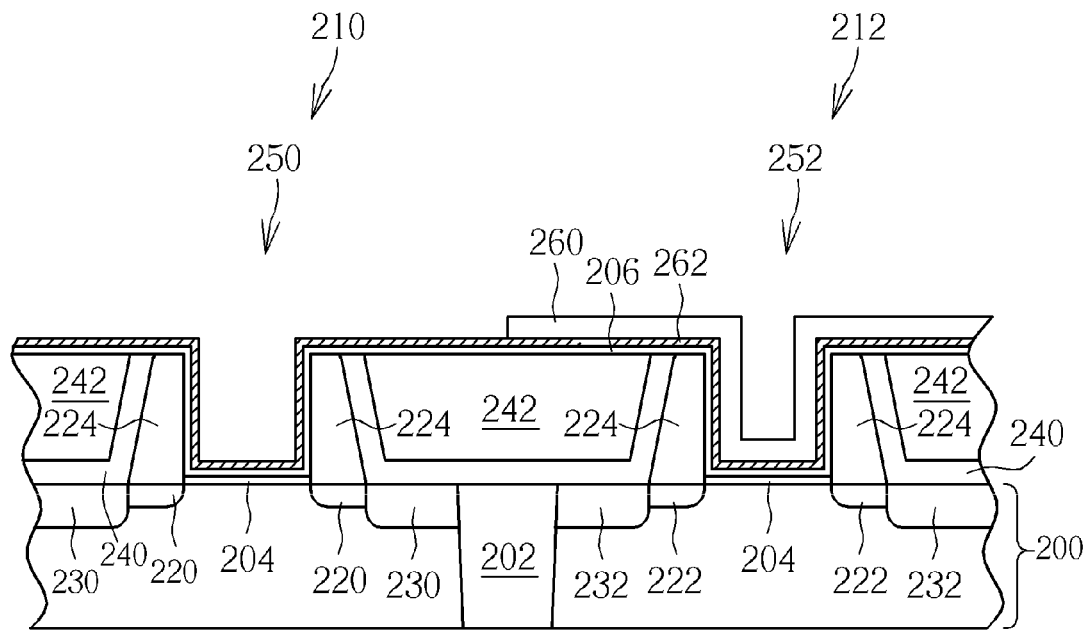

Please refer to FIG. 7. After sequentially forming the high-k gate dielectric layer 206, the TaN layer 262 and the first TiN layer 260, a patterned protecting layer (not shown) is formed on the substrate 200 to protect the first TiN layer 260 in the second semiconductor device 212. Subsequently, an etching process is performed to remove the exposed first TiN layer 260 from the first gate trench 250. Thus the TaN layer 262, which serves as an etch stop layer for protecting the underneath high-k gate dielectric layer 206, is exposed in the bottom and the sidewall of the first gate trench 250. In other words, the first TiN layer 260 remains in the second semiconductor device 212 only, particularly remains in the bottom and the sidewall of the second gate trench 252. As mentioned above, since the etching process consumes the TaN etch stop layer 262, a thickness of the TaN etch stop layer 262 in the first semiconductor device 210 is smaller than a thickness of the TaN etch stop layer in the second semiconductor device 212. Subsequently, the patterned protecting layer is removed.

Figure 8:
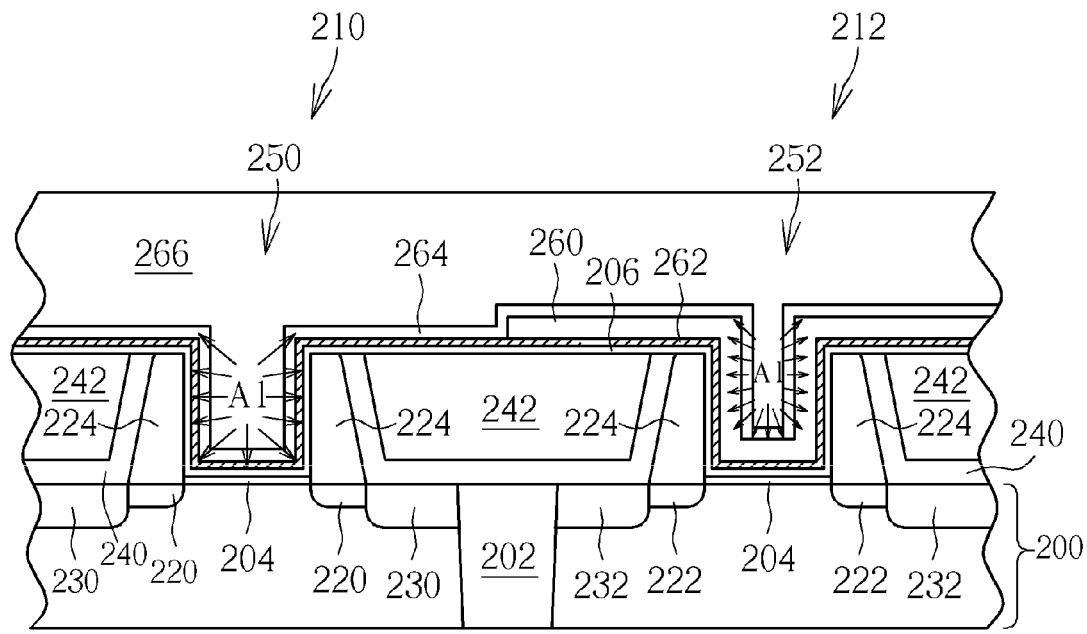

Please refer to FIG. 8. After removing the first TiN layer 260 from the first gate trench 250, a second TiN layer 264 and a filling metal layer 266 are sequentially formed on substrate 200. A thickness of the second TiN layer 264 is between 20 Å and 40 Å, but not limited to this. As shown in FIG. 8, the second TiN layer 264 in the first gate trench 250 is formed on the TaN etch stop layer 262 while the second TiN layer 264 in the second gate trench 252 is formed on the first TiN layer 260. It is noteworthy that simultaneously with forming the filling metal layer 266, Al ions diffuse into the second TiN layer 264 in the first gate trench 250 from the filling metal layer 266 as shown in FIG. 8. Thus a work function of the second TiN layer 264 in the first gate trench 250 is tuned to 4.35 eV, and a TiAlN layer which satisfies with the requirement of the n-type semiconductor device is obtained. In other words, the second TiN layer 264 in the first gate trench 250 is transmuted to be a second work function metal layer 268 (shown in FIG. 9) during forming the filling metal layer 266.

Please still refer to FIG. 8. It is also noteworthy that in the second gate trench 252, the second TiN layer 264 serves as a barrier layer, and thus the Al ions arrive only in the second TiN layer 264 but is obstructed from the first TiN layer 260 by the second TiN layer 264 in the second gate trench 252. In other words, the second TiN layer 264 in the first gate trench 250 is transmuted to be a TiAlN layer 268 after forming the filling metal layer 266 while the first TiN layer 260 in the second gate trench 252 still serves as a first work function metal layer and provides a work function required by p-type semiconductor device 212, that is 4.85 eV.

Figure 9:
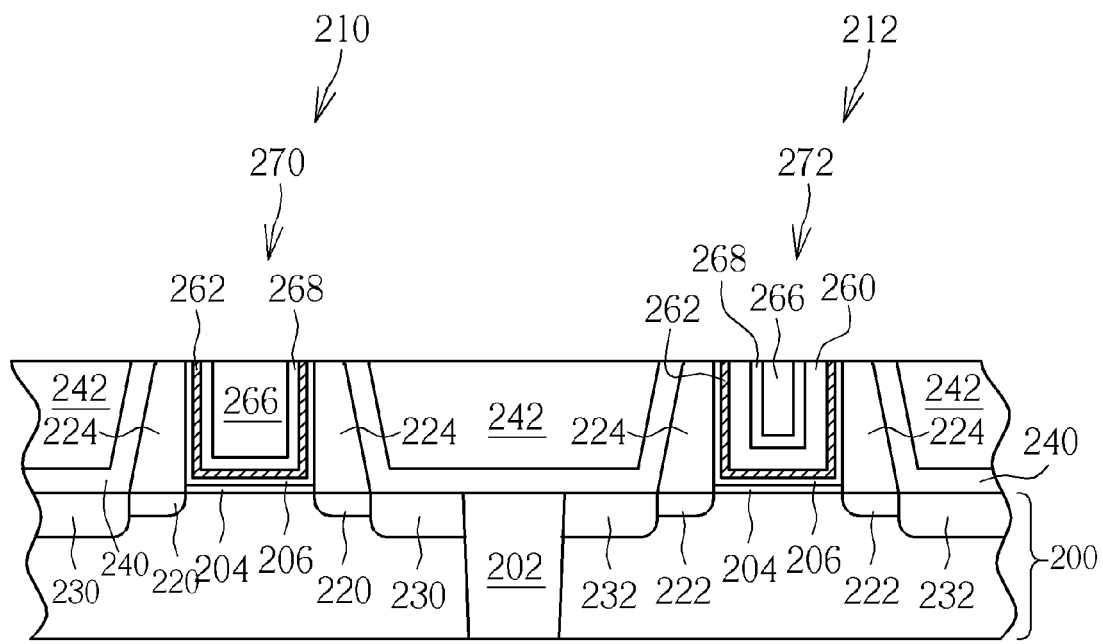

Please refer to FIG. 9. Subsequently, a planarization process, such as a CMP process, is performed to remove the unnecessary filling metal layer 266, second TiN layer 264, TaN layer 262, first TiN layer 260, and high-k gate dielectric layer 206. Consequently, a first metal gate 270 and a second metal gate 272 are obtained. In addition, the ILD layer 242 and the CESL 240 can be selectively removed and sequentially reformed on the substrate 200 for improving performance of the semiconductor devices 210/212 in the preferred embodiment. Since the abovementioned CMP process is well-known to those skilled in the art, those details are omitted in the interest of brevity.

Please refer to FIG. 9 again. According to the manufacturing method provided by the preferred embodiment, both of the first metal gate 270 and the second metal gate 272 include a TiAlN layer 268 having the Al ion diffused from the filling metal layer 266. And a thickness of the TiAlN layer 268 of the second metal gate 272 is substantially the same with a thickness of the TiAlN layer 268 of the first metal gate 270. Furthermore, the second metal gate 272 includes a TiN layer 260 having no diffused Al ion, and thus the work function of the TiN layer 260 is significantly different from the work function of the TiAlN layer 268. In other words, the TiAlN layer 268 in the first metal gate 270 serves as the work function metal layer for the first semiconductor device 210 while the TiN layer 260 in the second metal gate 272 serves as the work function metal layer for the second semiconductor device 212 with the TiAlN layer 268 in the second metal gate 272 serving as a barrier layer. Additionally, the first metal gate 270 and the second metal gate 272 further include the TaN etch stop layer 262 having different etching rate from the TiN layer 260. More important, the TaN etch stop layer 262 in the first metal gate 270 is formed between the high-k gate dielectric layer 206 and the TiAlN layer 268 while the TaN etch stop layer 262 in the second metal gate 272 is formed between the high-k gate dielectric layer 206 and the TiN layer 260.

According to the manufacturing method of the semiconductor device having metal gate provided by the preferred embodiment, the n-type work function metal layer 268 is spontaneously formed by Al diffusion during forming the filling metal layer 266. However, the p-type work function metal layer 260 is impervious to the Al diffusion due to the second TiN layer 264. Accordingly, the complicated steps for forming different work function metal layers and removing unnecessary work function metal layers in the prior art are simplified, and thus the process complexity is reduced, the gap-filling result is improved, and the yield of the metal gate process is improved.

Figure 10:
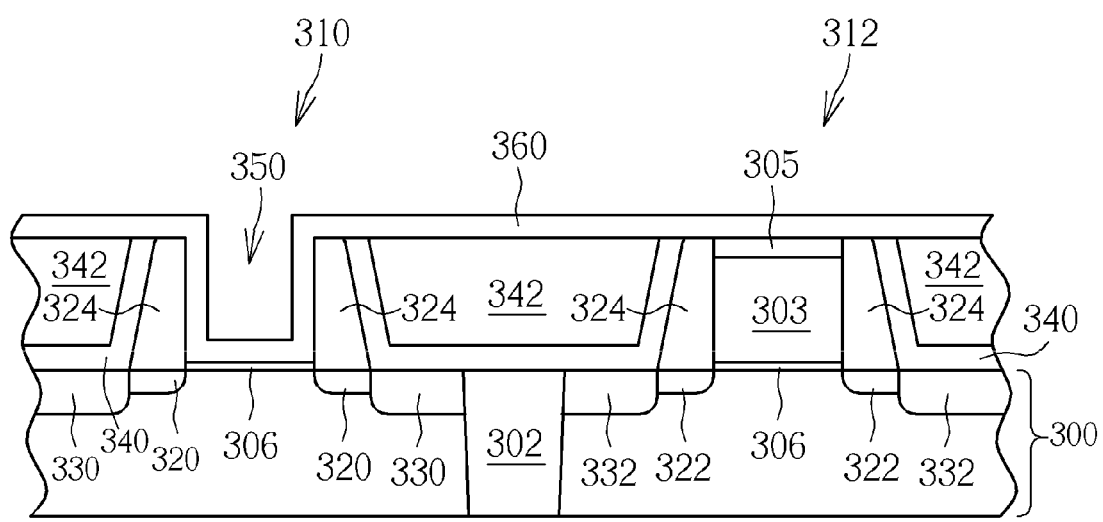

Please refer to FIGS. 10-13, which are drawings illustrating a manufacturing method for a semiconductor device having metal gate provided by a third preferred embodiment of the present invention. Please note that elements the same in the aforementioned preferred embodiments and the third preferred embodiment can include the same material, and thus those details are omitted in the interest of brevity. As shown in FIG. 10, the preferred embodiment first provides a substrate 300, and the substrate 300 includes a first semiconductor device 310 and a second semiconductor device 312 formed thereon. A STI 302 is formed between the first semiconductor device 310 and the second semiconductor device 312 in the substrate 300 for providing electrical isolation. The first semiconductor device 310 includes a first conductivity type, the second semiconductor device 312 includes a second conductivity type, and the first conductivity type and the second conductivity type are complementary. In the preferred embodiment, the first semiconductor device 310 is a p-type semiconductor device and the second semiconductor device 312 is an n-type semiconductor device.

Please still refer to FIG. 10. The first semiconductor device 310 and the second semiconductor device 312 respectively includes a dielectric layer 306, a selectively formed etch stop layer (not shown), a dummy gate such as a polysilicon layer 303 formed on the dielectric layer 306, and a patterned hard mask 305 formed on the polysilicon layer 303 for defining the dummy gate. It is noteworthy that the preferred embodiment can be integrated with the high-k first process or the high-k last process. When the preferred embodiment is integrated with the high-k first process, the dielectric layer 306 includes a high-k gate dielectric layer. The first semiconductor device 310 and the second semiconductor device 312 respectively include first LDDs 320 and second LDDs 322, a spacer 324, a first source/drain 330 and a second source/drain 332. Additionally, salicides (not shown) are respectively formed on the first source/drain 330 and the second source/drain 332. After forming the first semiconductor device 310 and the second semiconductor device 312, a CESL 340 and an ILD layer 342 are sequentially formed. Since the steps and material choices for the abovementioned elements are well-known to those skilled in the art, those details are omitted herein in the interest of brevity. Furthermore, selective strain scheme (SSS) can be used in the preferred embodiment. For example, a SEG method can be used to form the first source/drain 330 and the second source/drain 332.

Please still refer to FIG. 10. After forming the CESL 340 and the ILD layer 342, a planarization process, such as a CMP process is performed to remove a portion of the CESL 340 and a portion of the ILD layer 342 to expose the patterned hard masks 305 of the first semiconductor device 310 and the second semiconductor device 312. Subsequently, a patterned protecting layer (not shown) is formed to protect the second semiconductor device 312. Then, a suitable etching process is performed to remove the patterned hard mask 305 and the dummy gate 303 of the first semiconductor device 310. Consequently, a first gate trench 350 is formed in the first semiconductor device 310 with the high-k dielectric layers 306 exposed in a bottom of the first gate trench 350. After forming the first gate trench 350, a first TiN layer 360 is formed on the substrate 300. The first TiN layer 360 covers the bottom and the sidewall of the first gate trench 350, and a thickness of the first TiN layer 360 is between 30 Å and 40 Å, but not limited to this.

Figure 11:
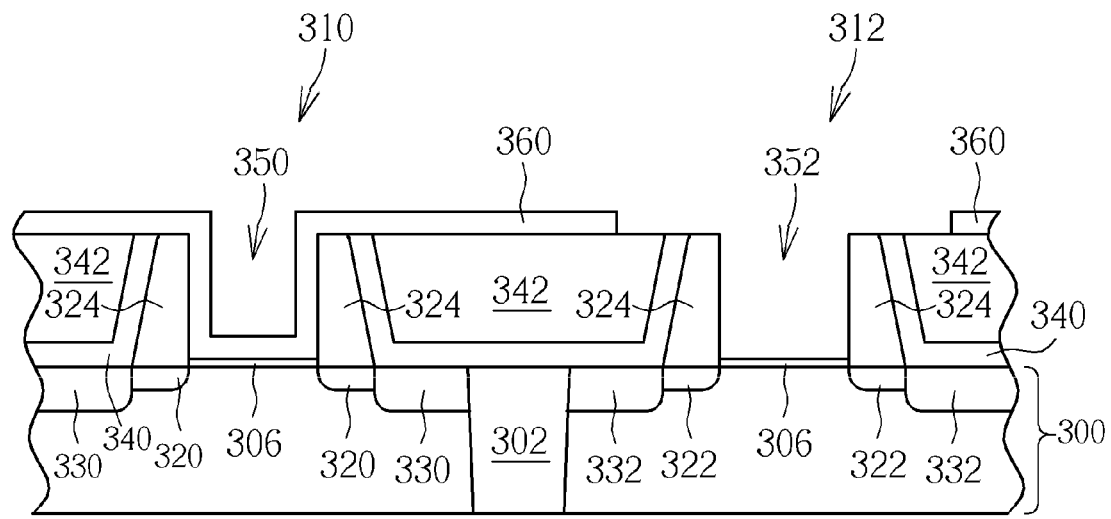

Please refer to FIG. 11. After forming the first TiN layer 360, another patterned protecting layer (not shown) is formed on the substrate 300 to protect the first TiN layer 360 in the first gate trench 350. Subsequently, the patterned hard mask 305 and the dummy gate 303 in the second semiconductor device 312 are removed and thus a second gate trench 352 is obtained. As shown in FIG. 11, the high-k gate dielectric layer 306 is exposed in a bottom of the second gate trench 352. Then, the patterned protecting layer is removed.

Figure 12:
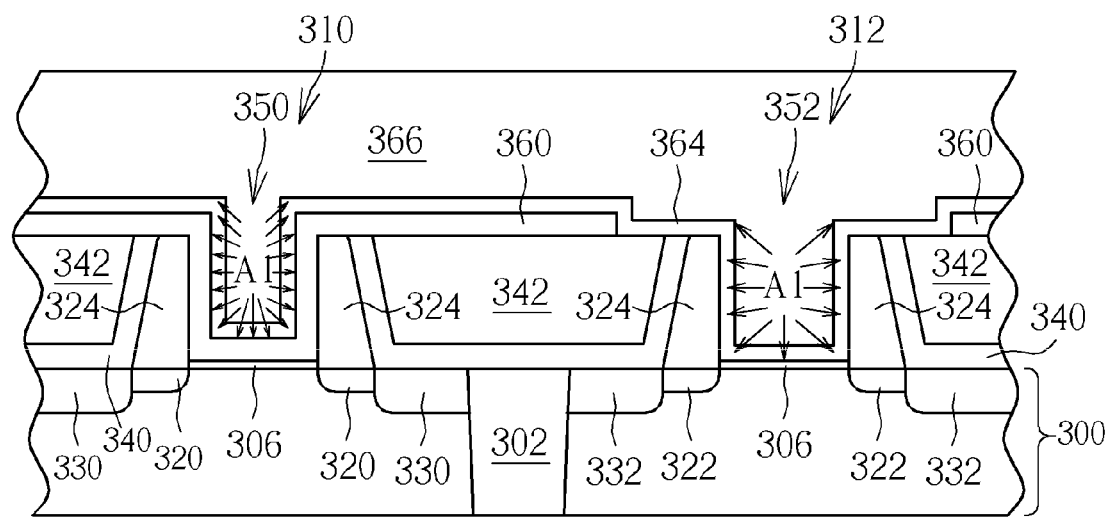

Please refer to FIG. 12. Next, a second TiN layer 364 and a filling metal layer 366 are sequentially formed on substrate 300. A thickness of the second TiN layer 364 is between 20 Å and 40 Å, but not limited to this. As shown in FIG. 12, the second TiN layer 364 in the first gate trench 350 is formed on the first TiN layer 360 while the second TiN layer 364 in the second gate trench 352 is formed on the high-k gate dielectric layer 306. It is noteworthy that since the first TiN layer 360 and the second TiN layer 364 include the same material, the first TiN layer 360 and the second TiN layer 364 can be taken as a thick TiN layer formed in the first gate trench 350. More important, simultaneously with forming the filling metal layer 366, Al ions diffuse into the second TiN layer 364 from the filling metal layer 366 as shown in FIG. 12. Thus a work function of the second TiN layer 364 is tuned to 4.35 eV, and a TiAlN layer which satisfies with the requirement of the n-type semiconductor device is obtained. In other words, the second TiN layer 364 in the second gate trench 352 is transmuted to be a second work function metal layer 368 (shown in FIG. 13) during forming the filling metal layer 366.

Please still refer to FIG. 12. It is also noteworthy that in the first gate trench 350, the second TiN layer 364 serves as a barrier layer, and thus the Al ions arrive only in the second TiN layer 364 but is obstructed from the first TiN layer 360 by the second TiN layer 364 in the first gate trench 350. In other words, the second TiN layer 364 in the second gate trench 352 is transmuted to be a TiAlN layer 368 (shown in FIG. 13) after forming the filling metal layer 366 while the first TiN layer 360 in the first gate trench 350 still serves as a first work function metal layer and provides a work function required by p-type semiconductor device 310, that is 4.85 eV.

Figure 13:
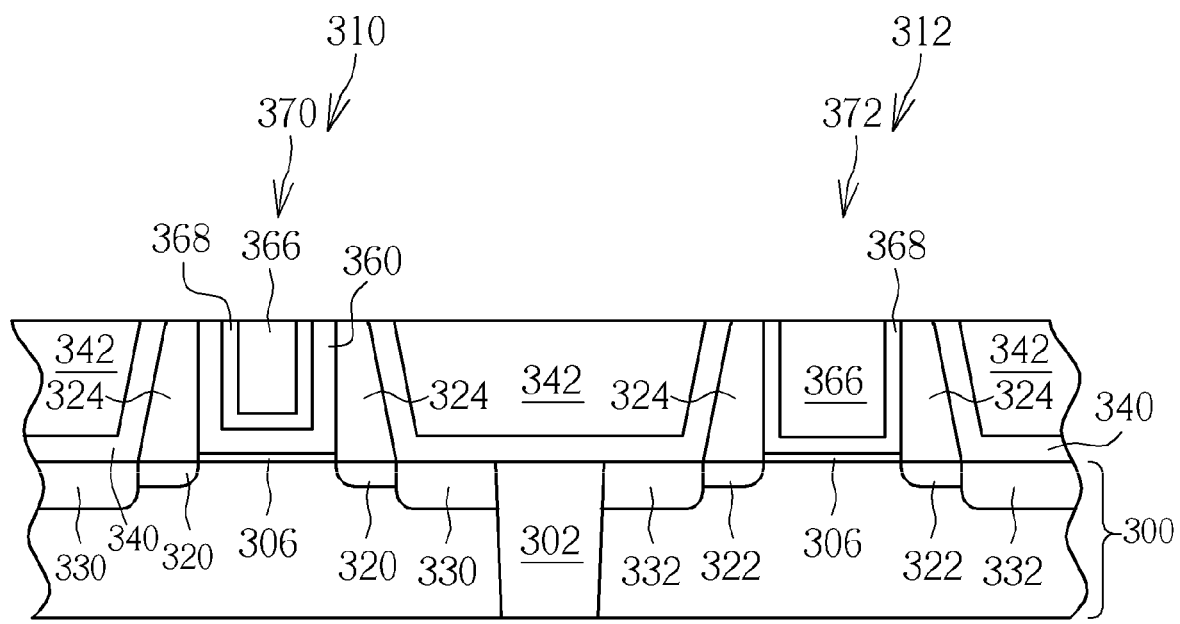

Please refer to FIG. 13. Subsequently, a planarization process, such as a CMP process, is performed to remove the unnecessary filling metal layer 366, second TiN layer 364, and first TiN layer 360. Consequently, a first metal gate 370 and a second metal gate 372 are obtained. In addition, the ILD layer 342 and the CESL 340 can be selectively removed and sequentially reformed on the substrate 300 for improving performance of the semiconductor devices 310/312 in the preferred embodiment. Since the abovementioned CMP process is well-known to those skilled in the art, those details are omitted in the interest of brevity.

Please refer to FIG. 13 again. According to the manufacturing method provided by the preferred embodiment, both of the first metal gate 370 and the second metal gate 372 include a TiAlN layer 368 having the Al ion diffused from the filling metal layer 366. And a thickness of the TiAlN layer 368 of the second metal gate 372 is the same with a thickness of the TiAlN layer 368 of the first metal gate 370. Furthermore, the second metal gate 372 includes a TiN layer 360 having no diffused Al ion, and thus the work function of the TiN layer 360 is significantly different from the work function of the TiAlN layer 368. In other words, the TiAlN layer 368 in the second metal gate 372 serves as the work function metal layer for the second semiconductor device 312 while the TiN layer 360 in the first metal gate 370 serves as the work function metal layer for the first semiconductor device 310 with the TiAlN layer 368 in the first metal gate 370 serving as a barrier layer.

According to the manufacturing method of the semiconductor device having metal gate provided by the preferred embodiment, the n-type work function metal layer 368 is spontaneously formed by Al diffusion during forming the filling metal layer 366. However, the p-type work function metal layer 360 is impervious to the Al diffusion due to the second TiN layer 364. Furthermore, by forming the first gate trench 350 and the second gate trench 352 separately, the TaN etch stop layer is no longer in need in the process. Accordingly, the complicated steps for forming different work function metal layers and removing unnecessary work function metal layers in the prior art are simplified, and thus the process complexity is reduced, the gap-filling result is improved, and the yield of the metal gate process is improved.

According to the manufacturing method of the semiconductor device having metal gate provided by the present invention, the first work function metal layer or the metal layer formed in the first gate trench is directly transmuted to be the second work function metal layer by forming the filling metal layer and by ion diffusion from the filling metal layer. Consequently, the complicated steps for forming different work function metal layers and removing unnecessary work function metal layers in the prior art are eliminated according to the manufacturing method of the present invention. Briefly speaking, the metal gate process is simplified, the process complexity is reduced, and the gap-filling result is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device having metal gate comprising:

a substrate;

a first metal gate positioned on the substrate, the first metal gate having a high-k gate dielectric layer, a first metal layer comprising a first work function, a filling metal layer, and an etch stop layer formed between the first metal layer and the filling metal layer; and a second metal gate positioned on the substrate, the second metal gate having the high-k gate dielectric layer, a second metal layer comprising the first work function, a third metal layer formed between the high-k gate dielectric layer and the second metal layer and comprising a second work function, an etch stop layer formed between the second metal layer and the third metal layer, and the filling metal layer, the second metal layer having materials the same with the first metal layer, but a thickness of the second metal layer is smaller than a thickness of the first metal layer, wherein the first work function and the second work function are different from each other.

2. The semiconductor device having metal gate according to claim 1, wherein an etching rate of the etch stop layer is different from etching rates of the first metal layer, the second metal layer, and the third metal layer.

3. The semiconductor device having metal gate according to claim 2, wherein the first metal layer comprises TiAlN, the second metal layer comprises TiAlN, the third metal layer comprises TiN, and the etch stop layer comprises TaN.

4. The semiconductor device having metal gate according to claim 2, wherein a thickness of the etch stop layer in the first metal gate is smaller than a thickness of the etch stop layer in the second metal gate.

* * * * *